United States Patent
Keating et al.

(10) Patent No.: US 7,888,143 B1
(45) Date of Patent: Feb. 15, 2011

(54) APPARATUS AND METHOD FOR CHARACTERIZING STRUCTURES WITHIN AN INTEGRATED CIRCUIT

(75) Inventors: Fergal W. Keating, Naas (IE); Cathal N. McAuley, Lucan (IE)

(73) Assignee: Xilinx, Inc., San Jose, CA (US)

( * ) Notice: Subject to any disclaimer, the term of this patent is extended or adjusted under 35 U.S.C. 154(b) by 267 days.

(21) Appl. No.: 12/182,928

(22) Filed: Jul. 30, 2008

(51) Int. Cl.
*G01R 31/26* (2006.01)

(52) U.S. Cl. .......................... 438/18; 324/754
(58) Field of Classification Search ............... 438/14, 438/17, 18; 250/309–311, 492.2–492.21; 324/754
See application file for complete search history.

(56) References Cited

U.S. PATENT DOCUMENTS 7,482,603 B2 * 1/2009 Tomimatsu et al. ...... 250/492.2
2006/0012385 A1 * 1/2006 Tsao et al. ................. 324/750

OTHER PUBLICATIONS

Schlangen, R. et al., "Non destructive 3D chip inspection with nano scale potential by use of backside FIB and backscattered electron microscopy," *Microelectronics Reliability*, Jul. 6, 2007, pp. 1533-1538, vol. 47, Issues 9-11, available online from www.sciencedirect.com.

McAuley, C.N. et al., "3D failure analysis in depth profiles on sequentially made FIB cuts," *Microelectronics Reliability*, Jul. 2, 2007, pp. 1595-1598, vol. 47, Issues 9-11, available online from www.sciencedirect.com.

* cited by examiner

*Primary Examiner*—David Vu
*Assistant Examiner*—Shaun Campbell
(74) *Attorney, Agent, or Firm*—Michael T. Wallace; Thomas George

(57) ABSTRACT

An apparatus and method of utilizing an electron beam and ion beam microscope in combination with nanomanipulators to improve the accuracy of the characterization of structures within an integrated circuit. Probes attached to the nanomanipulators, i.e., nano-probes, are applied to the features of interest via a first trench, while physical dimensions of the features of interest are altered via a second trench. As such, the nano-probes may remain attached to the feature being characterized, while alteration of the feature is conducted from the second trench to obtain 3-dimensional characterization of the feature of interest with improved accuracy. The nano-probes may also be used to apply the test stimulus to the features of interest, or conversely, an electron beam microscope may be used.

20 Claims, 5 Drawing Sheets

APPARATUS AND METHOD FOR CHARACTERIZING STRUCTURES WITHIN AN INTEGRATED CIRCUIT

FIELD OF THE INVENTION

The present invention generally relates to integrated circuits, and more particularly to the characterization of structures within the integrated circuits.

BACKGROUND OF THE INVENTION

Advances in the field of semiconductor integrated circuits have brought about higher levels of integration. Accordingly, semiconductor manufacturing process advancements are driving the corresponding geometric dimensions of semiconductor devices to decreasingly smaller values. 10 micrometer (μm) gate lengths, for example, were common in the 1970's, but continuously advancing semiconductor manufacturing processes have reduced gate lengths to well below 100 nanometers (nm). One key driver for these semiconductor manufacturing process advancements is the ability to quickly characterize failure mechanisms for each new manufacturing process technology so that production yields may be increased in a timely manner.

To further advance integration, multiple layers are incorporated into the integrated circuits so as to accommodate additional features and functionality within the integrated circuits. Some of the layers of the integrated circuits may be implemented as metal layers that provide the means to implement voltage and voltage reference planes within the integrated circuit. Other layers within the integrated circuit may be used to implement semiconductor features/devices and their corresponding interconnect. One or more conductive layers and/or signal traces may also be interconnected using vertical conductive tunnels, i.e., vias, that provide a conduction path between the one or more layers and associated interconnect.

Interconnect vias require a minimum diameter, so as to facilitate proper metallization of the via during the metallization stage of the manufacturing process. If the via diameter is too small, for example, incomplete metallization of the via may occur, which may cause the via to exhibit an abnormally high impedance characteristic as a consequence of the incomplete metallization of the via. As such, the via may be characterized as a defective structure contained within the integrated circuit.

Conventional techniques that may be used to characterize defective structures within integrated circuits are invasive, since in order to obtain exposure of the metal layers, signal traces, and/or vias, top layers of the integrated circuit must be sequentially removed until adequate exposure of the test area is obtained. Utilization of such a technique, however, results in an integrated circuit that is no longer useful for its intended purpose because the integrated circuit is generally non-functional after the measurements are complete due to the planarized destruction of the integrated circuit that is required to obtain access to the structures of interest.

In addition, such a planarized exposure technique does not allow for the characterization of vertical structures within the integrated circuit, since only a single layer of the integrated circuit may be exposed at any given time. Other similarly invasive techniques utilize a focused ion beam (FIB) to extract a portion of the semiconductor die to be analyzed. Once severed, the semiconductor die portion may then be analyzed with a scanning transmission electron microscope (STEM) or a transmission electron microscope (TEM) in an attempt to discover the failure mode.

Conventional integrated circuits may also be implemented within wafers that employ specialized test structures. Such specialized test structures may be mechanically probed using pre-defined test pads to determine the condition of the test structure. Conventional de-processing techniques may then be employed once the test structures are found to be defective. However, such de-processing techniques generally result in a wafer that must be discarded.

Thus, while conventional techniques are available to ascertain the failure modes and abnormalities within integrated circuits, invasive procedures must be invoked to determine the failure mode, which generally renders the integrated circuit unusable thereafter. Furthermore, such invasive procedures are relatively inadequate to properly characterize vertical structures that may be contained within the integrated circuit.

Efforts continue, therefore, to provide a technique whereby features within an integrated circuit may be characterized while substantially avoiding destruction of the integrated circuit once characterization is complete. In addition, improved techniques to more accurately characterize vertical structures within the integrated circuits are needed.

SUMMARY OF THE INVENTION

To overcome limitations in the prior art, and to overcome other limitations that will become apparent upon reading and understanding the present specification, various embodiments of the present invention disclose an apparatus and method to characterize structures within an integrated circuit.

In accordance with one embodiment of the invention, a method of characterizing a feature contained within an integrated circuit comprises identifying a feature contained within the integrated circuit, milling first and second trenches to expose first and second sides of the feature, applying a test stimulus to the feature, iteratively altering the feature, and characterizing the feature with the test stimulus after each iterative alteration. The test stimulus remains in contact with the feature during the iterative alterations.

In accordance with another embodiment of the invention, a semiconductor die characterization system comprises a dual beam microscope that is adapted to generate an electron beam and a focused ion beam. The semiconductor die characterization system further comprises a semiconductor die including a feature of interest, where milled trenches generated on either side of the feature of interest by the focused ion beam exposes two sides of the feature of interest. The semiconductor die characterization system further comprises a plurality of nano-probes coupled to a first side of the feature of interest, the plurality of nano-probes being adapted to characterize the feature of interest while physical dimensions of the feature of interest are iteratively altered by the focused ion beam.

In accordance with another embodiment of the invention, a method of characterizing a device under test contained within a semiconductor die using a semiconductor die characterization system comprises identifying the device under test contained within the semiconductor die, milling first and second trenches to expose first and second sides of the device under test utilizing a focused ion beam of the semiconductor die characterization system, iteratively altering the device under test using the focused ion beam, and characterizing the device under test after each iterative alteration. A test stimulus used to characterize the device under test remains in contact with the device under test during the iterative alterations.

BRIEF DESCRIPTION OF THE DRAWINGS

Various aspects and advantages of the invention will become apparent upon review of the following detailed description and upon reference to the drawings in which.

DETAILED DESCRIPTION

Figure 1A:
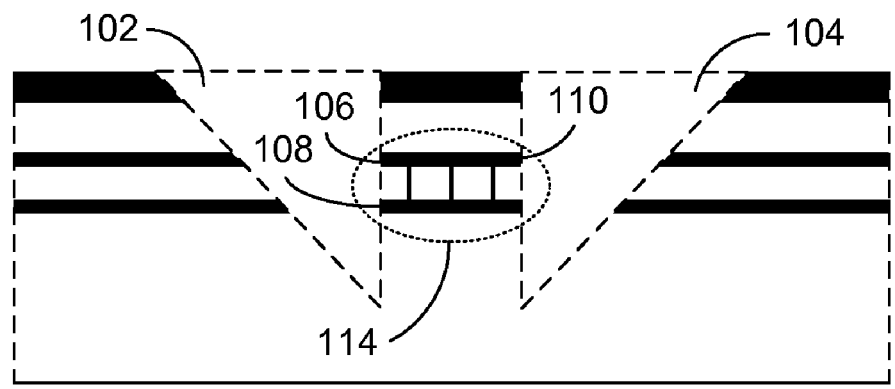
FIG. 1A exemplifies a semiconductor die exhibiting front-side trenches formed using a focused ion beam (FIB) in accordance with an embodiment of the present invention.

Generally, various embodiments of the present invention provide methods of utilizing a dual beam microscope in combination with nanomanipulators to improve the accuracy of the characterization of structures within an integrated circuit. Probes attached to the nanomanipulators, i.e., nano-probes, may be applied to the features of interest via a first trench, while physical dimensions of the features of interest are altered via a second trench. As such, the nano-probes may remain attached to the feature being characterized, while alteration of the feature is conducted from the second trench to obtain 3-dimensional characterization of the feature of interest with improved accuracy.

Characterization begins by identifying a semiconductor die area, or feature of interest, within a semiconductor die. Two or more trenches are then utilized to isolate the identified area, or feature of interest, so that the feature to be characterized exists between the trenches formed. In a first embodiment, focused ion beam (FIB) trenches may be formed to facilitate front-side access, whereby vertical trenches are milled from the top of the semiconductor die to isolate the test area. In an alternate embodiment, the FIB trenches may be formed to provide back-side access to the semiconductor die, whereby vertical trenches are milled from the bottom of the semiconductor die to isolate the test area. In other embodiments, the FIB trenches may be formed to provide front-side and back-side access to the semiconductor die, whereby vertical trenches are milled from the top and bottom of the semiconductor die to isolate the test area.

Once the two or more FIB trenches have been milled into the semiconductor die, electrical characterization measurements on the exposed vertical and/or horizontal structures, i.e., the device under test (DUT), within the semiconductor die may be executed. In a first embodiment, electrical stimuli may be injected into the DUT from the first trench using nano-probes, while physical dimensions of the DUT are altered by the FIB via the second trench. In an alternate embodiment, electrical stimuli may be injected into the DUT from the second trench, while physical alterations of the DUT are also being conducted from the second trench. In either embodiment, nano-probes are applied to the DUT via the first trench to measure electrical characteristics of the DUT in response to the injected stimuli, whereby after each measurement, physical attributes of the DUT are altered. As such, an improved correlation of measurement values may be obtained to more accurately characterize the DUT.

The length of a horizontal structure or an entire vertical structure within the semiconductor die, for example, may be iteratively modified/removed by the FIB via the second trench as electrical characterization measurements are being conducted via the first trench subsequent to each modification. In such instances, a 3-dimensional electrical characterization of the DUT may be implemented.

In one embodiment, for example, a new impedance measurement may be obtained from the DUT for each corresponding alteration of the DUT. Once the impedance measurement correlates to a desired impedance of the DUT, alterations of the DUT may cease and usage of the DUT may proceed as required.

Furthermore, the nano-probes need not be removed from the first trench between electrical measurements, since the DUT may be modified by the FIB via the second trench. Any measurement errors caused by nano-probe tip impedance variation are minimized because the nano-probe tips need only be applied to the DUT once, while iterative modifications to the DUT are being implemented. As such, contact resistance, contamination, and electromagnetic noise may be reduced because the need to successively remove and re-apply the nano-probe tips between electrical measurements is obviated.

In an alternate embodiment, electrical stimuli may be applied to the DUT by an electron beam microscope. In particular, an electron beam is placed on the DUT in a spot mode of operation within the second trench, while a beam current monitor within the microscope is used to record the magnitude of current flowing through the DUT. Nano-probes utilized within the first trench then characterize the behavior of the DUT in response to the electron beam. Further application allows characterization of active structures within the semiconductor die, such as transistors and diodes, whereby a dual beam microscope, e.g., electron and ion source, may be utilized to electrically stimulate and physically modify the DUT without the need to remove the DUT from the instrument chamber.

Thus, various embodiments of the present invention allow the use of an FIB to alter the geometry of the DUT, while the DUT is optionally stimulated and analyzed using nano-probes. In addition, 3-point probing may be accomplished through the use of two nano-probes in combination with an electron beam, whereby the electron beam is utilized as the source of electrical stimuli. Thus, the ability to probe and analyze horizontal and vertical structures within the semiconductor die is provided, regardless of layer location, using front and/or back side FIB trenches.

Turning to FIG. 1A, for example, front-side FIB milling is exemplified, whereby vertical trenches 102-104 are milled from the top of the semiconductor die to isolate test area 114. In particular, horizontal and vertical structures within test area 114 are isolated via trenches 102-104: 1) to allow nano-probes to be inserted into, e.g., trench 102, to facilitate nano-probe contact at probe locations, e.g., 106-108; 2) to allow physical modification of the DUT using FIB milling as discussed in more detail below; and 3) to allow electron beam excitation of the DUT at location, e.g., 110, to facilitate 3-point probing of the DUT using an electron microscope and two nano-probes.

Figure 1B:
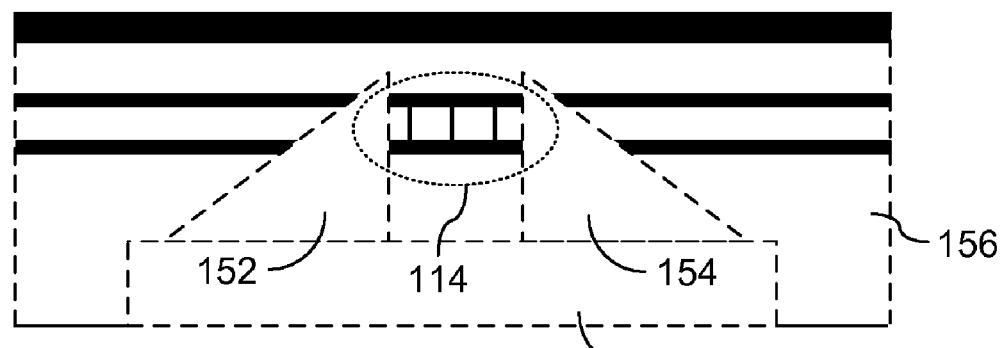
FIG. 1B exemplifies a semiconductor die exhibiting back-side trenches formed using a FIB in accordance with an embodiment of the present invention.

Turning to FIG. 1B, on the other hand, FIB milling is facilitated via back-side access, whereby vertical trenches 152-154 are milled from the bottom of the semiconductor die to isolate test area 114. First, section 158 is formed using mechanical thinning of the semiconductor die by removing a portion of bulk silicon 156. Vertical trenches 152-154 may then be FIB milled to isolate test area 114 as illustrated. Since FIB milling and semiconductor die thinning is performed on the back-side of the semiconductor die, i.e., through the bulk silicon area, the highly populated layers towards the top of the semiconductor die are avoided. As such, destruction of the vias, signal traces, semiconductor devices, etc., that exist within the semiconductor die is much less likely to occur and can be routinely performed during the testing phase of the semiconductor die at wafer sort and/or final test. Once characterized, vertical trenches 152-154 and section 158 may be backfilled with a non-conductive material, such as silicon dioxide, prior to final packaging.

Figure 1C:
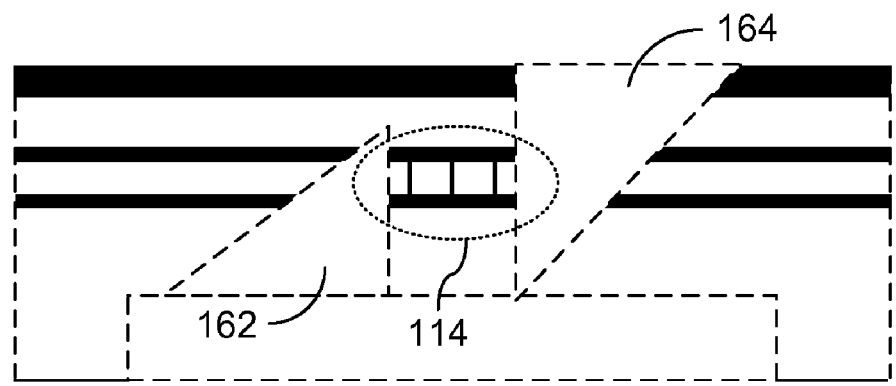
FIG. 1C exemplifies a semiconductor die exhibiting both front-side and back-side trenches formed using a FIB in accordance with an embodiment of the present invention.

In an alternate embodiment, as illustrated in FIG. 1C, both front-side and back-side access may be provided, whereby vertical trench 164 is milled from the top of the semiconductor die to isolate a first cross-section of test area 114 and vertical trench 162 is milled from the bottom of the semiconductor die to isolate a second cross-section of test area 114. Such an embodiment may be useful when physical modification of the feature encompassed within test area 114 is best facilitated from, e.g., the top side of the semiconductor die via trench 164, while nano-probing of the feature encompassed within test area 114 is best facilitated from, e.g., the bottom side of the semiconductor die via trench 162.

Figure 2A:
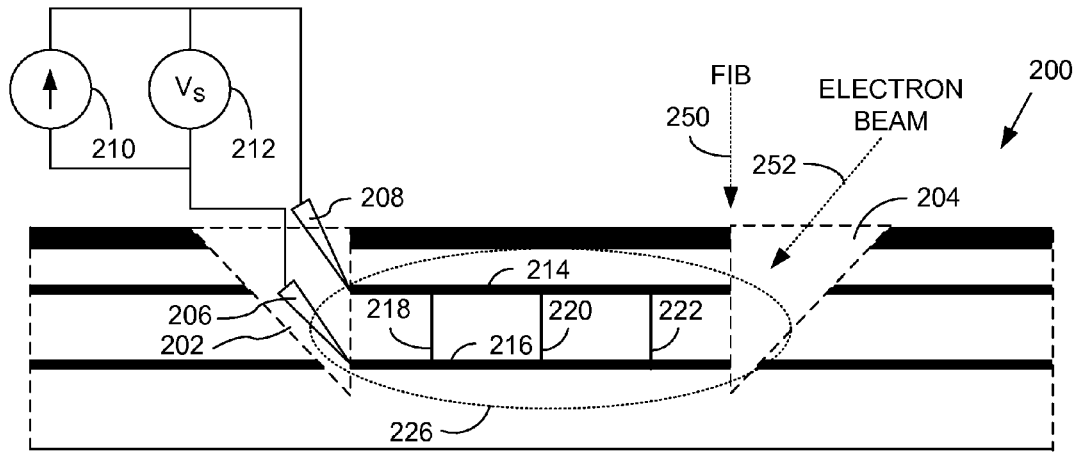
FIG. 2A illustrates the initial preparation of a semiconductor die prior to characterization of a structure contained within the semiconductor die in accordance with one embodiment of the present invention.
Figure 2B:
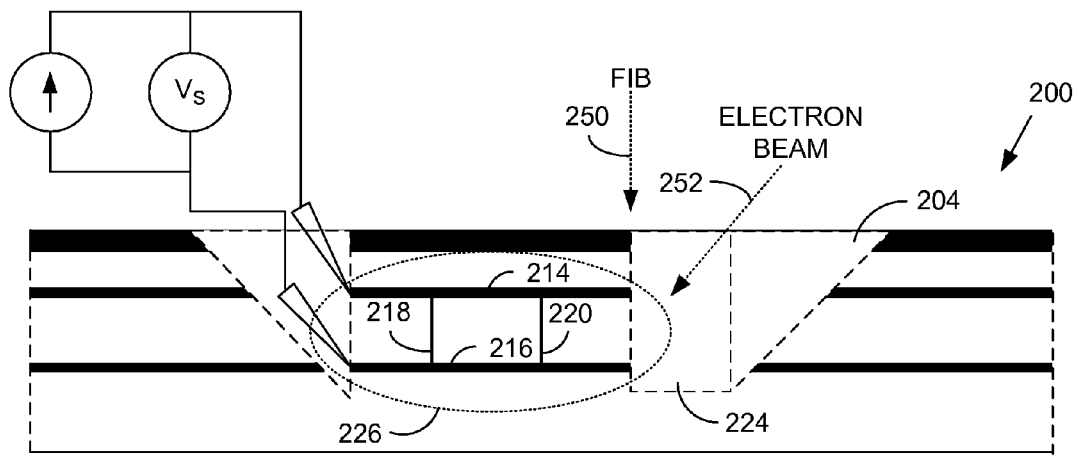
FIG. 2B illustrates the semiconductor die of FIG. 2A after a first alteration of the structure using a FIB.
Figure 2C:
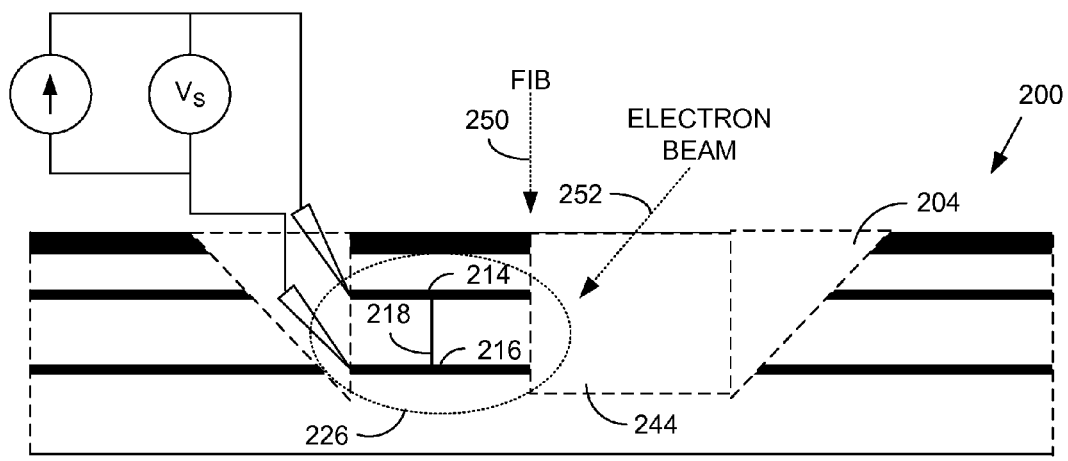
FIG. 2C illustrates the semiconductor die of FIG. 2B after a subsequent alteration of the structure using a FIB.

Turning to FIGS. 2A-2C, exemplary cross-sectional views of the various stages of DUT characterization are illustrated. While FIGS. 2A-2C illustrate the characterization of the DUT using front-side access, it is understood that back-side or a combination of front-side/back-side access my be similarly utilized as discussed above in relation to FIGS. 1A-1C. In FIG. 2A, semiconductor die 200 is initially prepared by milling trenches 202 and 204 using FIB 250 as illustrated. In particular, FIB 250 may be swept across the top side of semiconductor die 200, so as to remove portions of semiconductor die 200 to create trench 204, which facilitates access to one side of the DUT as illustrated. Similarly, FIB 250 may be swept across the top side of semiconductor die 200, so as to remove portions of semiconductor die 200 to create trench 202, which facilitates access to a second side of the DUT as illustrated. In so doing, it is seen that test area 226 is isolated by trenches 202 and 204, thereby exposing first and second vertical extensions of the DUT encompassed within test area 226.

The DUT encompassed within test area 226 includes horizontally oriented features 214 and 216 that are inter-connected using vertical features 218-222. In one embodiment, features 214 and 216 may represent signal traces, voltage planes, voltage reference planes, etc., and may be separated by one or more layers of dielectric, i.e., insulative material. Vertical features 218-222 are exemplified as vias, which are conductive so as to provide various conduction paths between features 214 and 216.

Characterization of the DUT may include an analysis of the DUT's impedance magnitude. Accordingly, current source 210 and nano-probes 206, 208 are utilized within trench 202 to create a current conduction path from current source 210 through nano-probe 208, horizontal features 214-216, vertical features 218-222, and nano-probe 206. By placing a high-impedance voltage meter, $V_S$ 212, across nano-probes 208 and 206 as illustrated, the impedance of the DUT encompassed within test area 226 may be deduced from equation (1):

$$R = \frac{V}{I}, \quad (1)$$

where R is the impedance magnitude and V is the voltage sensed by voltage meter 212 across the DUT in response to current, I, being injected into the DUT via current source 210. As illustrated, trench 202 facilitates contact with the DUT that is vertically extended with respect to the surface of semiconductor die 200 using two nano-probes, 206 and 208, so as to characterize the impedance magnitude of the DUT as in equation (1).

Once an impedance measurement has been taken, FIB 250 may be utilized to extend trench 204 toward trench 202 to create extended trench portion 224 as illustrated in FIG. 2B. Electron beam 252 may be simultaneously utilized, as within a dual-beam microscope, to monitor the progress of the extension of trench 204. Once trench portion 224 is created by FIB 250, it can be seen by inspection that portions of horizontal features 214 and 216, along with vertical feature 222, have been removed by FIB milling.

A second impedance measurement reveals the new impedance magnitude of the physically altered DUT. By comparing the amount of material removed from the DUT by the FIB milling process with the second impedance measurement, a 3-dimensional characterization of the impedance magnitude of the DUT may be ascertained. In addition, it is noted that nano-probes 206 and 208 need not be removed from trench 202 while trench portion 224 is being created by FIB 250. As such, contact resistance, contamination, and electromagnetic noise may be reduced because the need to successively remove and re-apply nano-probes 206 and 208 between milling operations is obviated.

Once the second impedance measurement has been taken, FIB 250 may be utilized once again to extend trench 204 toward trench 202 to create extended trench portion 244 as illustrated in FIG. 2C. Electron beam 252 may be simultaneously utilized, as within a dual-beam microscope, to monitor the progress of the extension of trench 204. Once trench portion 244 is created by FIB 250, it can be seen by inspection that additional portions of horizontal features 214 and 216, along with vertical feature 220, have been removed by FIB milling.

A third impedance measurement reveals the new impedance magnitude of the physically altered DUT. By comparing the amount of material removed from the DUT by the FIB milling process with the third impedance measurement, the 3-dimensional characterization of the impedance magnitude of the DUT may be extended. As discussed above in relation to FIG. 2B, it is noted that nano-probes 206 and 208 need not be removed from trench 202 while trench portion 244 is being created by FIB 250.

Figure 3:
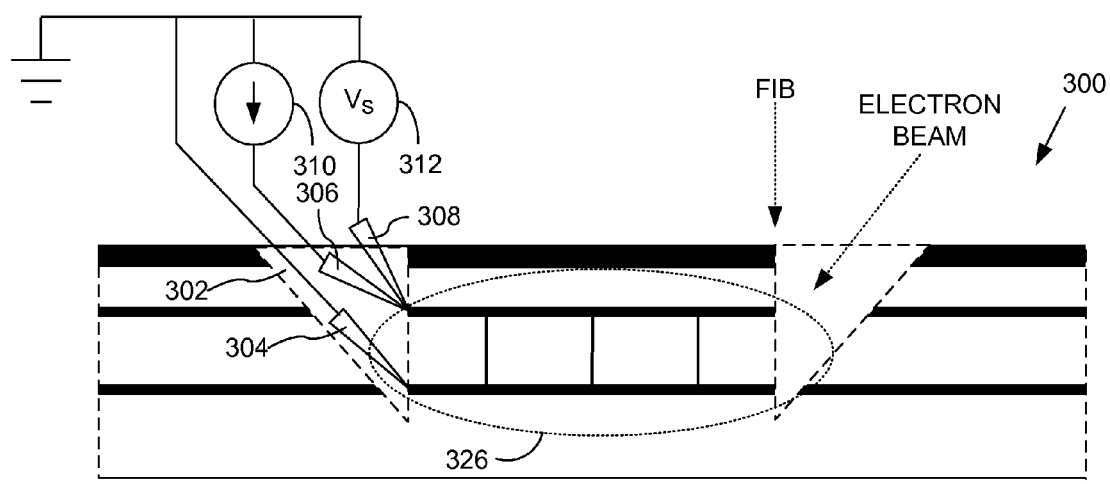
FIG. 3 illustrates an alternate embodiment in accordance with the present invention whereby 3-point probing is utilized to characterize the structure contained within the semiconductor die.

Turning to FIG. 3, an alternate embodiment of DUT characterization is illustrated, whereby 3-point nano-probing may be utilized. Current source 310 and nano-probes 304-306 are utilized within trench 302 to create a current conduction path from current source 310 through nano-probe 306, test area 326, and nano-probe 304. By placing a high-impedance voltage meter, $V_S$ 312, across nano-probes 308 and 304 as illustrated, the impedance of the DUT encompassed within test area 326 may be deduced by equation (1).

As illustrated, trench 302 facilitates contact with the DUT that is vertically extended with respect to the surface of semiconductor die 300 using three nano-probes 304-308. As discussed above with respect to FIGS. 2A-2C, nano-probes 304-308 may remain in contact with a first cross section of the DUT, while a second cross section of the DUT may be physically altered to create a 3-dimensional characterization of the impedance magnitude of the DUT.

Figure 4:
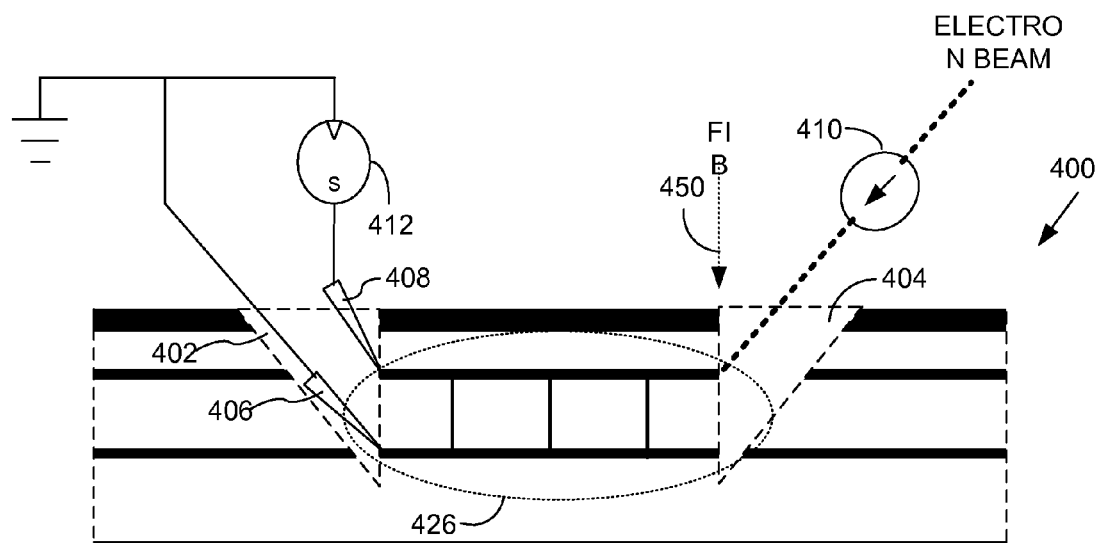
FIG. 4 illustrates an alternate embodiment in accordance with the present invention whereby 2-point probing in combination with an electron beam is utilized to characterize the structure contained within the semiconductor die.

Turning to FIG. 4, an alternate embodiment of DUT characterization is illustrated, whereby 2-point nano-probing in conjunction with an electron beam current source is utilized. In particular, an electron beam is placed on the DUT encompassed by test area 426 in a spot mode of operation within trench 404, while beam current monitor 410 within the dual-beam microscope is used to record the magnitude of current that is induced to flow through the DUT. By placing a high-impedance voltage meter, $V_S$ 412, across nano-probes 406 and 408 as illustrated, the impedance of the DUT encompassed within test area 426 may be deduced as in equation (1).

As illustrated, trench 402 facilitates contact with the DUT that is vertically extended with respect to the surface of semiconductor die 400 using two nano-probes, 406 and 408, so as to characterize the impedance magnitude of the DUT using an electron beam as a current source. Once an impedance measurement has been taken, FIB 450 may also be generated within the dual-beam microscope and may be utilized to extend trench 404 toward trench 402 to physically alter the DUT, while taking further impedance measurements to implement 3-dimensional characterization.

In an alternate embodiment, test area 426 may encompass active components, such as transistors and diodes, whereby the electron beam is utilized to characterize the conductive state of the active component. The drain or source region of a field effect transistor (FET), for example, may be stimulated by the electron beam, while the potential magnitude at the gate terminal of the FET is varied. Nano-probes may then be applied to the FET in its conductive state to characterize, for example, the FET's drain to source resistance, $R_{DS}$, while the FET operates in the ohmic, or linear, mode.

Figure 5:
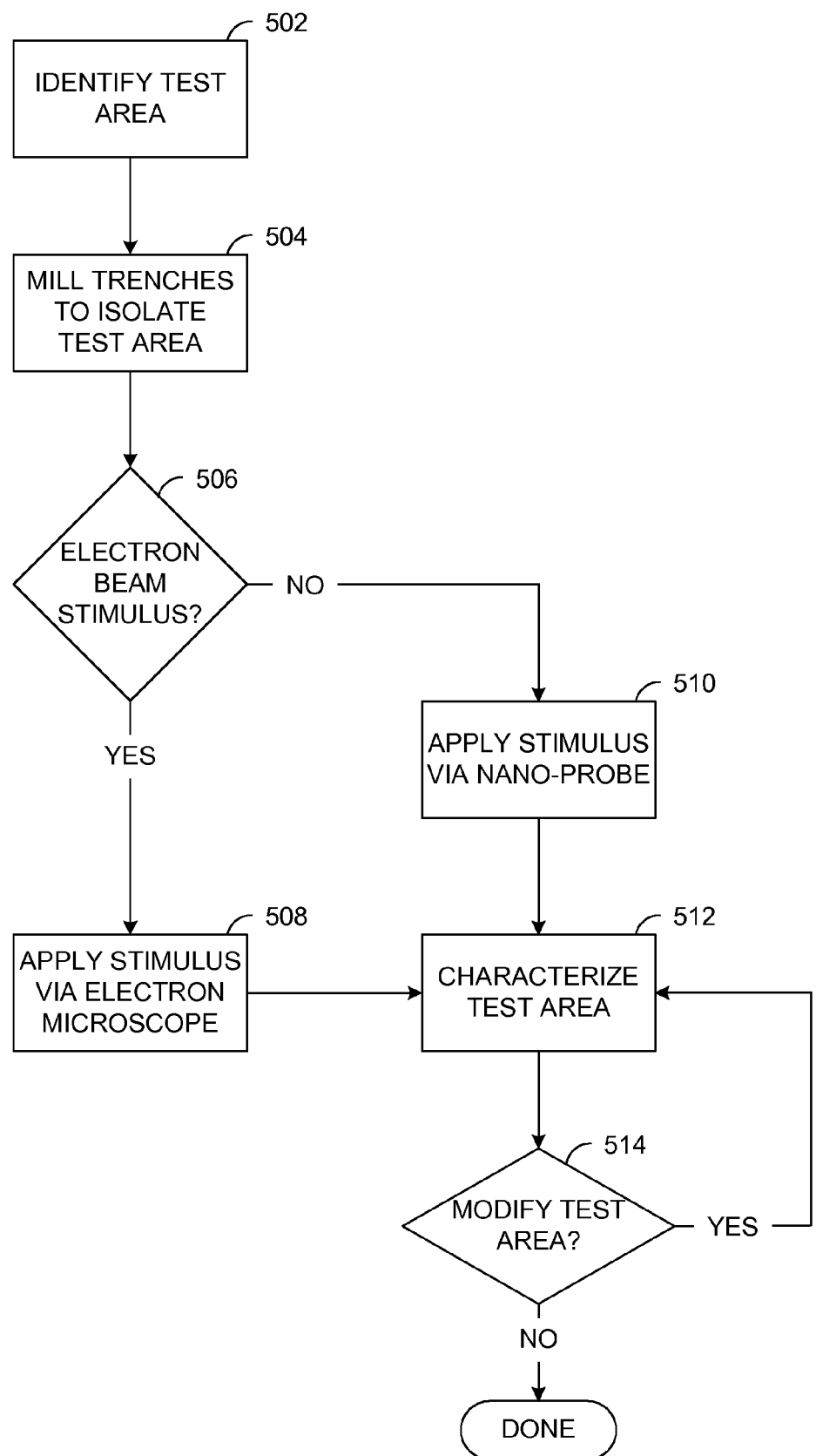
FIG. 5 illustrates a flow diagram exemplifying the characterization of semiconductor die features in accordance with one embodiment of the present invention.

Turning to FIG. 5, a flow diagram exemplifying the characterization of semiconductor die features is illustrated. In step 502, a semiconductor die area, or feature of interest, is identified within the semiconductor die. In step 504, FIB trenches are formed to facilitate front-side characterization, as discussed above in relation to FIG. 1A, of the feature of interest. Alternately, FIB trenches may be formed in step 504 to facilitate back-side characterization, as discussed above in relation to FIG. 1B, of the feature of interest. In alternate embodiments, both front-side and back-side access may be facilitated in step 504, as discussed above in relation to FIG. 1C, whereby a first vertical trench is milled from the top of the semiconductor die to isolate a first cross-section of the test area and a second vertical trench is milled from the bottom of the semiconductor die to isolate a second cross-section of the test area.

Once the two or more FIB trenches have been milled into the semiconductor die, electrical characterization measurements on the exposed vertical and/or horizontal structures of the DUT within the semiconductor die may be executed. If an electron beam stimulus is to be utilized, as determined in step 506, then an electron beam may provide the test stimulus in step 508 as discussed above in relation to FIG. 4. If not, then nano-probe stimulus is utilized in step 510, as discussed above in relation to FIGS. 2A-2C and 3.

If electron beam stimulus is utilized, then an electron beam may be generated by a dual-beam microscope and placed on the DUT encompassed by test area 426 in a spot mode of operation within trench 404 as in step 508. Beam current monitor 410 within the dual-beam microscope is used to record the magnitude of current flowing through the DUT. By placing a high-impedance voltage meter, $V_S$ 412, across nano-probes 406 and 408, the impedance of the DUT encompassed within test area 426 may be deduced as in equation (1) to characterize the test area in step 512.

Once an impedance measurement has been taken, FIB 450 may also be generated within the dual-beam microscope and utilized to extend trench 404 toward trench 402 to physically alter the DUT, as in step 514, while taking further impedance measurements for 3-dimensional characterization. In other words, steps 512-514 may be repeated until a 3-dimensional characterization of the DUT is completed. It is noted that nano-probes 406 and 408 are not removed from the DUT while steps 512-514 are repeated, thereby increasing the accuracy of measurements taken.

If an electron beam is not to be used as the test stimulus, then nano-probe stimulus is instead utilized as in step 510. In such an instance, current source 210 and two nano-probes 206, 208 are utilized within trench 202 to create a current conduction path from current source 210 through nano-probe 208, horizontal features 214-216, vertical features 218-222, and nano-probe 206 as in step 510. By placing a high-impedance voltage meter, $V_S$ 212, across nano-probes 208 and 206, the impedance of the DUT encompassed within test area 226 may be deduced from equation (1).

Once an impedance measurement has been taken, as in step 512, FIB 250 may be utilized to extend trench 204 toward trench 202 to create extended trench portion 224 as in step 514. Subsequent impedance measurements and DUT modifications may be repeated as in steps 512-514 to implement a 3-dimensional characterization of the impedance magnitude of the DUT. It is noted that nano-probes 206 and 208 need not be removed from trench 202, while steps 512-514 are repeated, thereby increasing the accuracy of measurements taken.

Alternately, 3-point nano-probing may be utilized as discussed above in relation to FIG. 3. In particular, current source 310 and nano-probes 304-306 are utilized within trench 302 to create a current conduction path from current source 310 through nano-probe 306, test area 326, and nano-probe 304 as in step 510. By placing a high-impedance voltage meter, $V_S$ 312, across nano-probes 308 and 304 as illustrated, the impedance of the DUT encompassed within test area 326 may be deduced by equation (1).

As illustrated, trench 302 facilitates contact with the DUT that is vertically extended with respect to the surface of semiconductor die 300 using three nano-probes 304-308. Nano-probes 304-308 may remain in contact with a first cross section of the DUT, while a second cross section of the DUT may be physically altered to create a 3-dimensional characterization of the impedance magnitude of the DUT as in steps 512-514.

Other aspects and embodiments of the present invention will be apparent to those skilled in the art from consideration of the specification and practice of the invention disclosed herein. For example, the present invention may be utilized to characterize any structure by applying a known stimulus to the structure while incrementally modifying physical aspects of the structure during the characterization. In addition, a previously characterized structure may be similarly modified to accurately alter the characteristics of the structure using a known stimulus in an automated environment. It is intended that the specification and illustrated embodiments be considered as examples only, with a true scope and spirit of the invention being indicated by the following claims.

What is claimed is:

1. A method of characterizing a feature contained within an integrated circuit, comprising:
    identifying a feature contained within the integrated circuit;
    milling first and second trenches to expose first and second sides of the feature;
    applying a test stimulus to the feature;
    iteratively altering the feature; and
    characterizing the feature with the test stimulus after each iterative alteration, wherein the test stimulus remains in contact with the feature during the iterative alterations,
    wherein iteratively altering the feature comprises iteratively extending the second trench toward the first trench.

2. The method of claim 1, wherein the feature is iteratively altered in response to the characterization of the feature to obtain desired attributes of the altered feature.

3. The method of claim 1, wherein identifying a feature contained within the integrated circuit comprises identifying vertical structures of the feature.

4. The method of claim 3, wherein identifying a feature contained within the integrated circuit further comprises identifying horizontal structures of the feature.

5. The method of claim 1, wherein the first and second trenches are milled from a top side of the integrated circuit.

6. The method of claim 1, wherein the first and second trenches are milled from a bottom side of the integrated circuit.

7. The method of claim 1, wherein the first and second trenches are milled from top and bottom sides, respectively, of the integrated circuit.

8. The method of claim 1, wherein applying a test stimulus to the feature comprises injecting a current into the feature using nano-probes inserted into the first trench.

9. The method of claim 8, wherein characterizing the feature comprises applying nano-probes across the feature in the first trench to measure a voltage developed across the feature in response to the injected current.

10. The method of claim 1, wherein applying a test stimulus to the feature comprises inducing a current into the feature using an electron beam placed on the feature via the second trench.

11. The method of claim 10, wherein characterizing the feature comprises applying nano-probes across the feature in the first trench to measure a voltage developed across the feature in response to the induced current.

12. The method of claim 1, wherein iteratively altering the feature comprises utilizing a focused ion beam to remove portions of the structure exposed by the second trench.

13. A semiconductor die characterization system, comprising:
    a dual beam microscope, the dual beam microscope being adapted to generate an electron beam and a focused ion beam;
    a semiconductor die including a feature of interest, wherein milled trenches generated on either side of the feature of interest by the focused ion beam exposes two sides of the feature of interest; and
    a plurality of nano-probes coupled to a first side of the feature of interest, the plurality of nano-probes being adapted to characterize the feature of interest while physical dimensions of the feature of interest are iteratively altered by the focused ion beam.

14. The semiconductor die characterization system of claim 13, wherein the plurality of nano-probes are adapted to inject a current into the feature of interest and are further adapted to measure a voltage induced across the feature of interest by the injected current.

15. The semiconductor die characterization system of claim 13, wherein the electron beam is adapted to induce a current into the feature of interest and the plurality of nano-probes are adapted to measure a voltage developed across the feature of interest by the induced current.

16. A method of characterizing a device under test contained within a semiconductor die using a semiconductor die characterization system, the method comprising:
    identifying the device under test contained within the semiconductor die;
    milling first and second trenches to expose first and second sides of the device under test utilizing a focused ion beam of the semiconductor die characterization system;
    iteratively altering the device under test using the focused ion beam; and
    characterizing the device under test after each iterative alteration, wherein a test stimulus used to characterize the device under test remains in contact with the device under test during the iterative alterations,
    wherein iteratively altering the device comprises iteratively extending the second trench toward the first trench.

17. The method of claim 16 wherein iterative alterations of the device under test are performed to produce desired electrical characteristics associated with the device under test.

18. The method of claim 16, wherein characterizing the device under test comprises:
    injecting a current into the device under test using nano-probes inserted into the first trench; and
    applying nano-probes across the device under test in the first trench to measure a voltage developed across the device under test in response to the injected current.

19. The method of claim 16, wherein characterizing the device under test comprises:
    inducing a current into the device under test using an electron beam of the semiconductor die characterization system, the electron beam being placed on the device under test via the second trench; and
    applying nano-probes across the device under test in the first trench to measure a voltage developed across the device under test in response to the induced current.

20. The method of claim 16, wherein iteratively altering the device under test comprises utilizing a focused ion beam of the semiconductor die characterization system to remove portions of the device under test exposed by the second trench.

* * * * *